US010185353B2

(12) United States Patent
Dunn et al.

(10) Patent No.: US 10,185,353 B2
(45) Date of Patent: Jan. 22, 2019

(54) ELECTRONIC DISPLAY WITH MOUNT-ACCESSIBLE COMPONENTS

(71) Applicant: Manufacturing Resources International, Inc., Alpharetta, GA (US)

(72) Inventors: William Dunn, Alpharetta, GA (US); David Williams, Canton, GA (US); Ware Bedell, Cumming, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 15/589,552

(22) Filed: May 8, 2017

(65) Prior Publication Data
US 2017/0242454 A1 Aug. 24, 2017

Related U.S. Application Data

(63) Continuation of application No. 12/684,608, filed on Jan. 8, 2010, now Pat. No. 9,648,270.
(Continued)

(51) Int. Cl.
*H05K 5/00* (2006.01)
*G06F 1/16* (2006.01)
*G06F 1/18* (2006.01)
*H04N 5/63* (2006.01)
*H04N 5/64* (2006.01)
(Continued)

(52) U.S. Cl.
CPC ............ *G06F 1/1601* (2013.01); *G06F 1/181* (2013.01); *H01R 12/7076* (2013.01); *H01R 12/73* (2013.01); *H04N 5/63* (2013.01); *H04N 5/64* (2013.01); *H04N 5/655* (2013.01); *H05K 1/117* (2013.01); *G06F 2200/1612* (2013.01); *H01L 23/3107* (2013.01); *H01L 23/32* (2013.01); *H01R 23/70* (2013.01); *H01R 23/7005* (2013.01); *H05K 2201/044* (2013.01);
(Continued)

(58) Field of Classification Search
CPC ....................................... G06F 1/1601
USPC ..................................... 361/679.21
See application file for complete search history.

(56) References Cited

U.S. PATENT DOCUMENTS 5,621,890 A * 4/1997 Notarianni ............ G06F 1/1632
361/724
5,631,805 A 5/1997 Bonsall
(Continued)

FOREIGN PATENT DOCUMENTS

JP 2000122575 A 4/2000
JP 2006145890 A 6/2006
(Continued)

Primary Examiner — Binh B Tran
(74) Attorney, Agent, or Firm — Standley Law Group LLP

(57) ABSTRACT

An electronic display where various electrical components may be removed from a housing of the display and serviced or replaced without having to demount the display. The electronic display may include an electronic image-producing assembly in electrical communication with a backplane. Various electrical components (e.g., electronic assemblies) may be removably connected to the backplane using self-guiding electrical connectors. An access opening through a wall of the housing may be provided to facilitate removal of an electrical assembly through the housing while the display remains mounted to a vertical surface.

20 Claims, 4 Drawing Sheets

Related U.S. Application Data

(60) Provisional application No. 61/143,189, filed on Jan. 8, 2009.

(51) Int. Cl.
  *H01R 12/70* (2011.01)
  *H01R 12/73* (2011.01)
  *H04N 5/655* (2006.01)
  *H05K 1/11* (2006.01)
  *H01R 12/50* (2011.01)
  *H01L 23/31* (2006.01)
  *H01L 23/32* (2006.01)

(52) U.S. Cl.
  CPC ............... *H05K 2201/0999* (2013.01); *H05K 2201/09754* (2013.01); *H05K 2201/1034* (2013.01)

(56) References Cited

U.S. PATENT DOCUMENTS

| | | |
|---|---|---|
| 5,636,101 A | 6/1997 | Bonsall et al. |
| 5,640,302 A * | 6/1997 | Kikinis ............... G06F 1/1616 361/679.26 |
| 5,729,289 A | 3/1998 | Etoh |
| 5,786,801 A | 7/1998 | Ichise |
| 5,952,992 A | 9/1999 | Helms |
| 6,144,359 A | 11/2000 | Grave |
| 6,292,157 B1 | 9/2001 | Greene et al. |
| 6,330,150 B1 | 12/2001 | Kim |
| 6,639,790 B2 | 10/2003 | Tsai et al. |
| 6,812,851 B1 | 11/2004 | Dukach et al. |
| 6,850,209 B2 | 2/2005 | Mankins et al. |
| 6,937,258 B2 | 8/2005 | Lim et al. |
| 6,962,528 B2 | 11/2005 | Yokota |
| 7,064,672 B2 * | 6/2006 | Gothard ................ G06F 1/16 312/223.2 |
| 7,092,248 B2 | 8/2006 | Shu |
| 7,230,659 B2 | 6/2007 | Ha et al. |
| 7,334,361 B2 | 2/2008 | Schrimpf et al. |
| 7,339,782 B1 | 3/2008 | Landes et al. |
| 7,513,830 B2 | 4/2009 | Hajder et al. |
| 7,518,600 B2 | 4/2009 | Lee |
| 7,589,958 B2 | 9/2009 | Smith |
| 7,609,506 B2 | 10/2009 | Aguirre |
| 7,774,633 B1 | 8/2010 | Harrenstien et al. |
| 8,102,173 B2 | 1/2012 | Merrow |
| 8,116,081 B2 | 2/2012 | Crick, Jr. |
| 8,144,110 B2 | 3/2012 | Huang |
| 8,310,824 B2 | 11/2012 | Dunn et al. |
| 8,352,758 B2 | 1/2013 | Atkins |
| 9,072,166 B2 | 6/2015 | Dunn et al. |
| 9,286,020 B2 | 3/2016 | Dunn et al. |
| 9,313,447 B2 | 4/2016 | Dunn et al. |
| 9,451,060 B1 | 9/2016 | Bowers et al. |
| 9,516,485 B1 | 12/2016 | Bowers et al. |
| 9,578,273 B2 | 2/2017 | Dunn et al. |
| 9,622,392 B1 | 4/2017 | Bowers et al. |
| 9,648,270 B2 | 5/2017 | Williams et al. |
| 2001/0043290 A1 | 11/2001 | Yamamoto |
| 2002/0112026 A1 | 8/2002 | Fridman et al. |
| 2002/0140651 A1 | 10/2002 | Lim et al. |
| 2002/0164962 A1 | 11/2002 | Mankins et al. |
| 2002/0186333 A1 | 12/2002 | Ha et al. |
| 2003/0039094 A1 | 2/2003 | Sarkinen et al. |
| 2003/0204342 A1 | 10/2003 | Law et al. |
| 2004/0036697 A1 | 2/2004 | Kim et al. |
| 2004/0257492 A1 | 12/2004 | Mai et al. |
| 2005/0007500 A1 | 1/2005 | Lin et al. |
| 2005/0073518 A1 | 4/2005 | Bontempi |
| 2005/0162822 A1 | 7/2005 | Shu |
| 2005/0202879 A1 | 9/2005 | Hussaini et al. |
| 2005/0231457 A1 | 10/2005 | Yamamoto et al. |
| 2006/0103299 A1 | 5/2006 | Kwok et al. |
| 2006/0215421 A1 | 9/2006 | Chang et al. |
| 2006/0218828 A1 | 10/2006 | Schrimpf et al. |
| 2006/0238531 A1 | 10/2006 | Wang |
| 2006/0292931 A1 | 12/2006 | Tokuda |
| 2007/0267554 A1 | 11/2007 | Tannas, Jr. |
| 2008/0002350 A1 | 1/2008 | Farrugia |
| 2008/0018584 A1 | 1/2008 | Park et al. |
| 2008/0024268 A1 | 1/2008 | Wong et al. |
| 2008/0055297 A1 | 3/2008 | Park |
| 2008/0084166 A1 | 4/2008 | Tsai |
| 2008/0143187 A1 | 6/2008 | Hoekstra et al. |
| 2008/0304219 A1 | 12/2008 | Chen |
| 2009/0009997 A1 | 1/2009 | Sanfilippo et al. |
| 2010/0164836 A1 * | 7/2010 | Liberatore ............ G06F 1/1616 345/1.1 |

FOREIGN PATENT DOCUMENTS

| | | |
|---|---|---|
| JP | 2007087662 A | 4/2007 |
| JP | 2008046435 A | 2/2008 |
| KR | 20000021499 A | 4/2000 |
| KR | 20020072633 A | 9/2002 |
| KR | 20030088786 A | 11/2003 |
| KR | 20050023882 A | 3/2005 |
| KR | 1020060030424 | 4/2006 |
| KR | 20070070711 A | 7/2007 |
| KR | 20080000144 A | 1/2008 |
| KR | 20080029114 A | 4/2008 |
| KR | 1020080046335 A | 5/2008 |
| WO | WO2008050402 A | 5/2008 |

\* cited by examiner

ELECTRONIC DISPLAY WITH MOUNT-ACCESSIBLE COMPONENTS

CROSS-REFERENCE TO RELATED APPLICATIONS

This application is a continuation of U.S. application Ser. No. 12/684,608 filed on Jan. 8, 2010, which claims the benefit of U.S. Provisional Application No. 61/143,189 filed on Jan. 8, 2009, both of which are hereby incorporated by reference as if fully recited herein.

TECHNICAL FIELD

Exemplary embodiments relate generally to an electronic display with components that may be removed and replaced without removing the electronic display from a mounted position.

BACKGROUND AND SUMMARY OF THE EXEMPLARY EMBODIMENTS

Electronic displays have become useful for not only indoor entertainment purposes, but also for indoor and outdoor advertising/informational purposes. For example, liquid crystal displays (LCDs), plasma displays, and many other flat panel displays are now being used to display information and advertising materials to consumers in locations outside of their own home, such as within airports, arenas, stadiums, restaurants/bars, gas station pumps, billboards, and even moving displays on the tops of automobiles or on the sides of trucks.

The rapid development of flat panel displays has allowed for mounting in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays. Displays that can provide these features typically contain a number of advanced electronic assemblies, which over time, can fail or degrade in performance. Once these displays are mounted in a desired position, replacing any failed electronic assemblies can be a costly and time-consuming process. Further, electronic assembly replacement typically requires a 'clean room' environment or further special equipment. Still further, special knowledge and training on the specific technologies involved is often required to trouble-shoot and service these advanced displays.

Exemplary electronic display embodiments include electronic assemblies that may be removed, serviced, and/or replaced without removing the display from its mounted position. The electronic assemblies can be removed through an opening in a housing of the electronic display, and may electrically connect to associated components of the display using self-aligning connectors such as blind mate connectors. N+1 power supplies may be utilized to increase the reliability of an exemplary electronic display (where N is the number of power supplies required to run the display).

Exemplary electronic display embodiments facilitate quick servicing by minimally-trained personnel while the display remains in its mounted position. An end user may even service an exemplary electronic display themselves. Further, a plurality of different electronic display configurations can be sold, all of which are based on the same display platform. Thus, end users may select the precise components they desire or may upgrade original components based on alternative or improved technologies. This may reduce manufacturing costs as display manufacturers can produce only a few base models that may be later adapted to the precise requirements of the end user.

BRIEF DESCRIPTION OF THE DRAWINGS

A better understanding will be obtained from a reading of the following detailed description and the accompanying drawings wherein identical reference characters refer to identical parts and in which.

DETAILED DESCRIPTION OF EXEMPLARY EMBODIMENTS

Figure 1A:
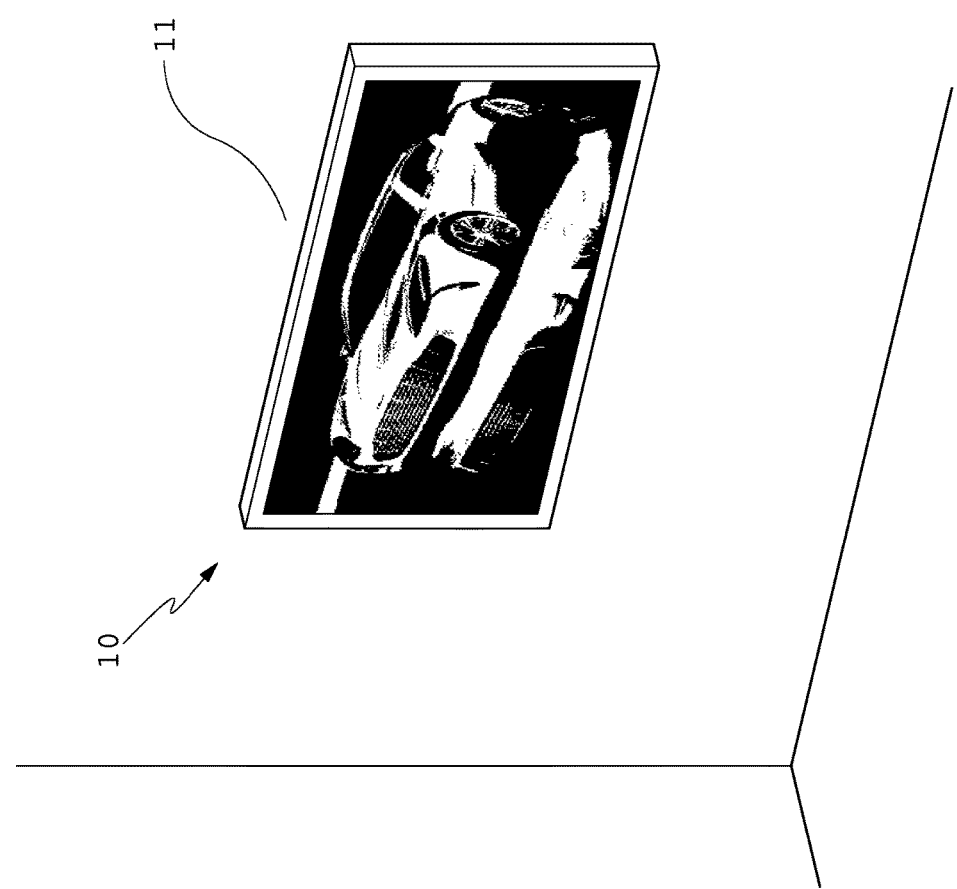
FIG. 1A is a perspective illustration of an exemplary electronic display embodiment in a mounted position.

FIG. 1A shows an exemplary electronic display 10 mounted on a vertical surface 11. When electronic components fail in traditional electronic displays, the entire electronic display typically must be removed from its mounted positioned, disassembled, and then serviced. Servicing a traditional electronic display may require a host of special equipment and training, and often further requires a near 'clean room' environment. Exemplary electronic display embodiments shown and described herein are designed to reduce the time and complexity involved in servicing displays and, notably, allows said displays to remain mounted while being serviced.

Figure 1B:
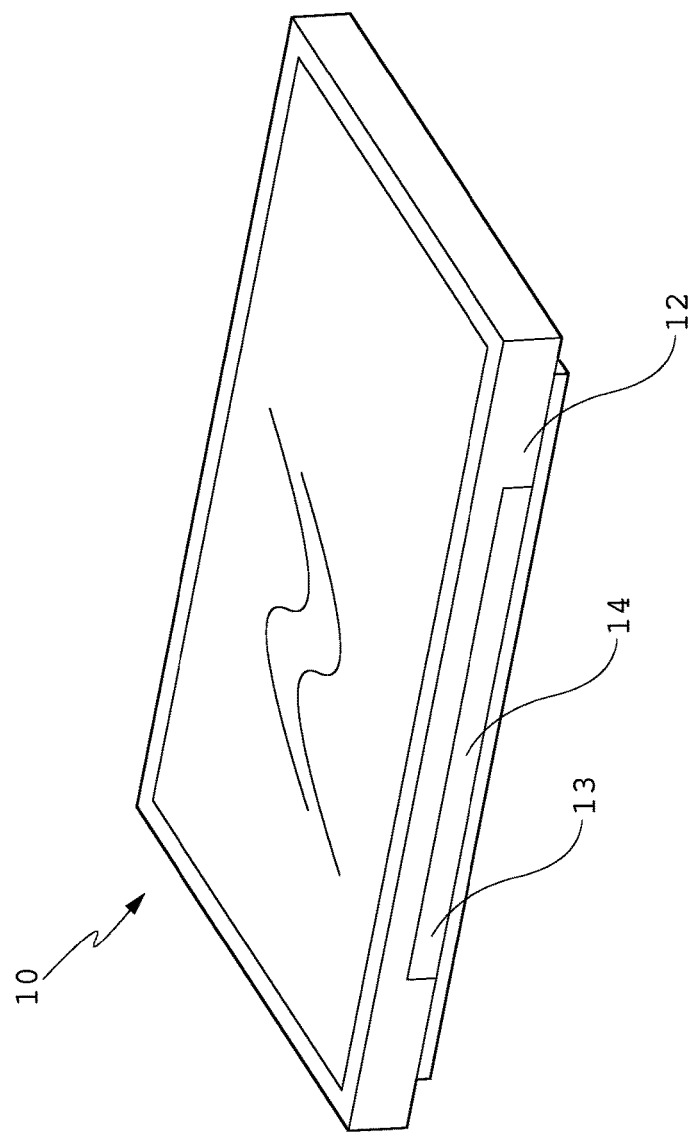
FIG. 1B is a perspective view of the exemplary embodiment of FIG. 1A showing the underside of a housing of the electronic display.

FIG. 1B shows a bottom surface 12 of electronic display 10. An access panel 13 is used in this exemplary embodiment to cover an opening to a compartment within which reside a number of removable electronic assemblies (see FIG. 1C). The access panel 13 may be secured using a lock mechanism 14, which may prevent unauthorized persons from gaining access to the removable electronic assemblies.

Figure 1C:
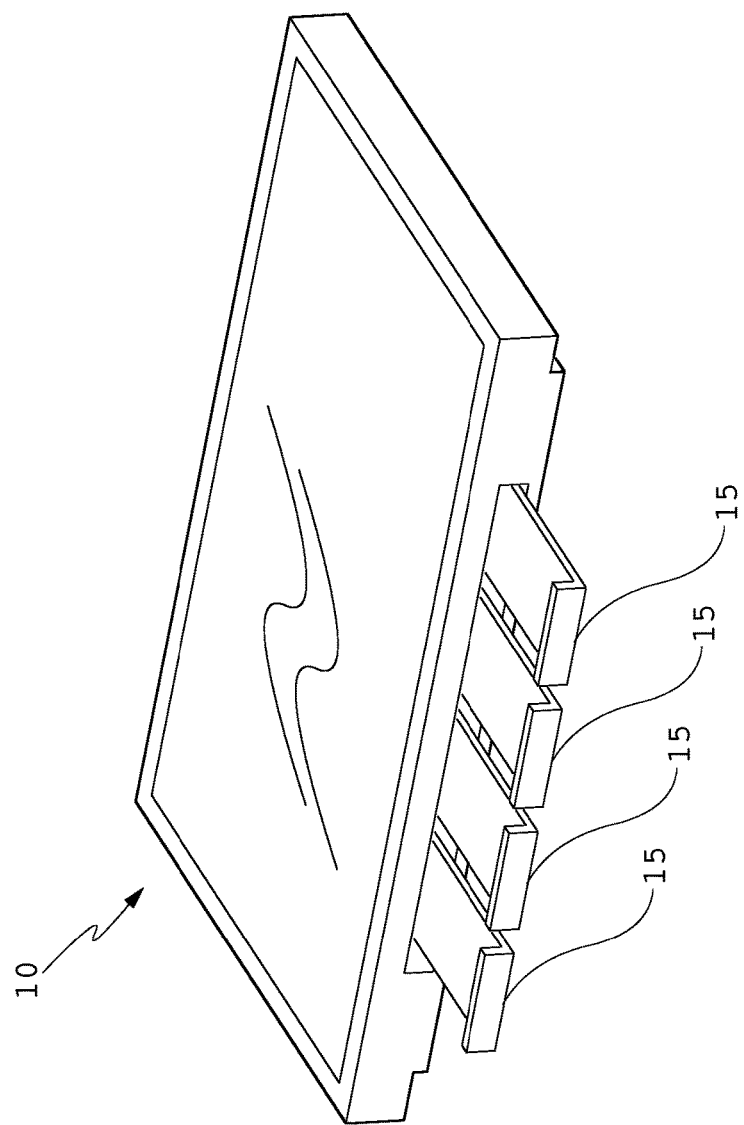
FIG. 1C is a perspective view of the exemplary embodiment from FIG. 1B with an access cover removed from the housing and removable electronic assemblies being accessed through an opening in the housing.

FIG. 1C shows the exemplary electronic display 10 of FIGS. 1A and 1B with the access panel 13 removed and a plurality of electronic assemblies 15 being extracted through the opening. The removable electronic assemblies 15 may be any number of electronic assemblies that are known to occasionally fail. These electronic assemblies may include, but are not limited to, any one of the following: power supplies, analog/digital (A/D) converters, or timing control units (T-cons).

Figure 2:
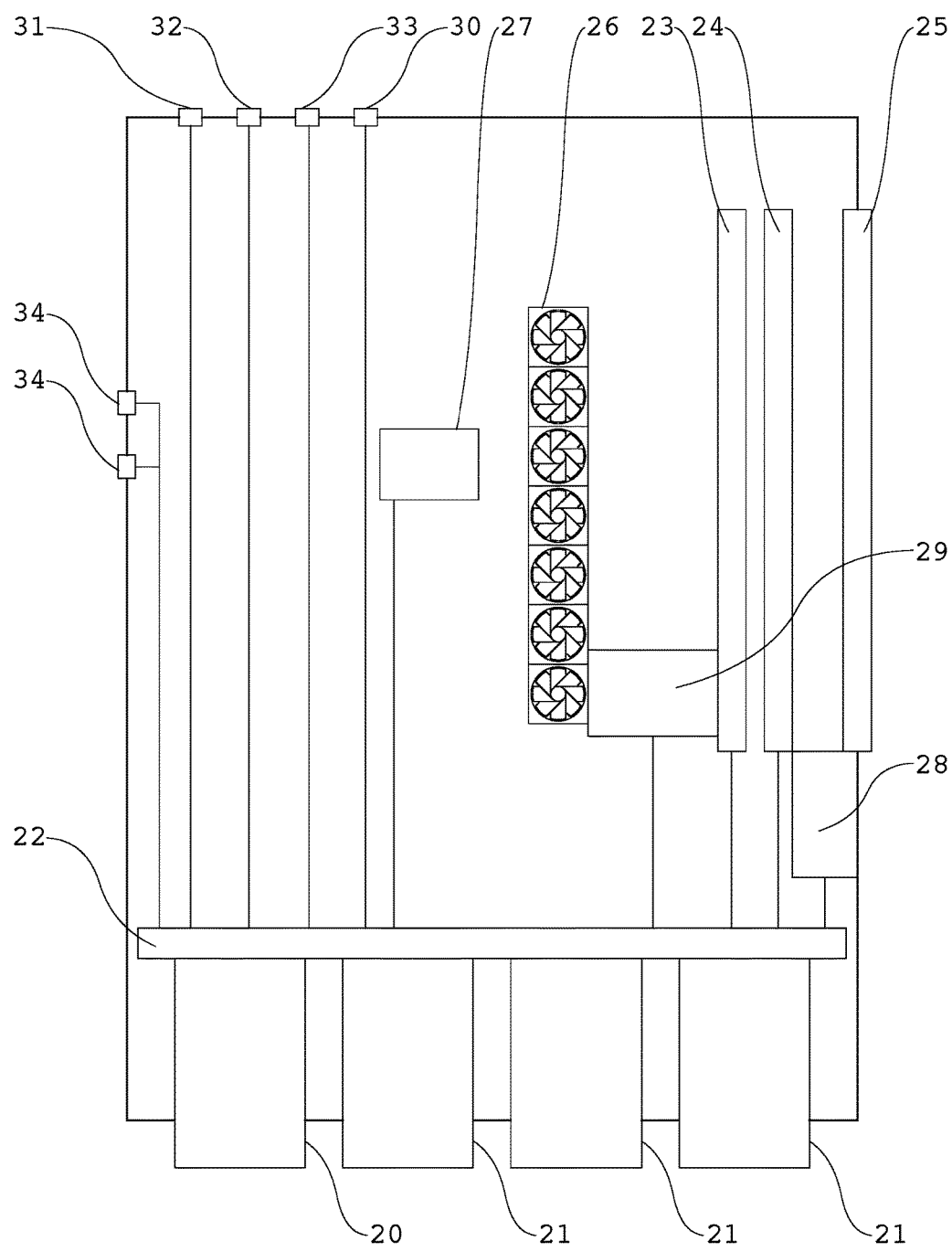
FIG. 2 is a schematic diagram showing various electrical connections for one exemplary electronic display embodiment.

FIG. 2 is a schematic wiring diagram for one exemplary embodiment of an electronic display. In this embodiment, a Tcon has been integrated with an A/D converter into a single display controller assembly 20. This integration allows the complete removal of a low-voltage differential signaling (LVDS) cable. LVDS cables are typically used in traditional displays, and are also known to fail after extended operation. As represented in FIG. 2, this exemplary electronic display embodiment also includes three separate removable power supplies (or power modules) 21. In a preferred embodiment, the removable power supplies 21 are capable of being hot swapped while the electronic display is in operation. For large displays, the removable power supplies 21 may supply, for example, 500 Watts at 24 VDC.

Using the N+1 technique, only two power supplies may be necessary to run the display shown. Thus, during normal operation only two of the three power supplies 21 will be utilized. However, upon failure of one of the power supplies, the remaining two are adequate to run the display until the failed power supply can be replaced. Communication between a backplane 22 and the display controller assembly 20 may instruct an exterior LED to illuminate in order to indicate to a user the need to service the display, and more particularly, that one of the power supplies needs to be replaced. The N+1 technique is extremely useful for displays which provide critical functions and require near constant operation with little or no downtime. It should be noted that the N+1 technique is merely optional, and is not required by any of the various exemplary embodiments. Each of the removable electronic assemblies 20 and 21 may connect with the display backplane 22 using self-aligning connectors such as blind-mate connectors.

FIG. 2 also indicates that the exemplary electronic display embodiment includes a backlight 23, a LCD assembly 24, and a display panel 25. The backlight 23 may be a CCFL or light emitting diode (LED) backlight. It should be noted that although the setup for an LCD is shown, embodiments can be practiced with any electronic image-producing assembly. Thus any other flat panel display could be used such as plasma, light-emitting polymer, and organic light emitting diode (OLED) displays. A fan assembly 26 is also shown for optionally cooling displays that may reach elevated temperatures. One or more temperature sensors 27 may be used to monitor the temperature of the display, and selectively engage the fan assembly 26. An ambient light sensor may be used to tailor the output of the backlight 23 to provide proper illumination based on the surrounding environment.

A variety of different electrical inputs/outputs are also shown in FIG. 2. For example, an AC power input 30 delivers incoming AC power to the backplane 22. A video signal input 31 is provided and is designed to receive video signals from a plurality of different sources. In a preferred embodiment, the video signal input 31 is a HDMI input. Two data interface connections 32 and 33 are also shown. The first data interface connection 32 may be a RS2332 port or an IEEE 802.3 jack, which may facilitate user setup and system monitoring. Either form of the connection should allow electrical communication with a personal computer. The second data interface connection 33 may be a network connection such as an Ethernet port or a wireless connection. The second data interface connection 33 may be utilized to transmit display settings, error messages, and various other forms of data to a website for access and control by the user. Optional audio connections 34 may also be provided for connection to internal or external speaker assemblies.

It should be noted that the wiring diagram shown in FIG. 2 does not require the particular placement and/or wiring of each component as shown therein. Furthermore, the various sensors, electrical connections, and other components are not drawn to scale, nor are they required to be placed in the positions shown.

It should also be noted that integration of the Tcon and A/D converter and elimination of the LVDS cable of a traditional display is not required by the various exemplary electronic display embodiments. Rather, in some exemplary electronic display embodiments a Tcon, A/D converter and LVDS cable may still be provided as separate components, and as either fixed or removable assemblies. The exemplary embodiment shown in FIG. 2 is provided only to illustrate a simplistic manner for creating a durable display. Other combinations of removable assemblies and fixed assemblies are particularly contemplated and would be within the scope of the inventive electronic display embodiments.

Information for monitoring the status of the various display components of an electronic display may be transmitted through either of the two data interface connections 32 and 33, to provide a notification to a user when a component may be functioning improperly, is about to fail, or has already failed, and requires replacement. Alternatively, or in combination, external indicators on the display may also notify a user that display components may need attention. Exterior LEDs, watermarks in the display picture, or other attention-grabbing devices may be used to alert a user to errors within the display. The information for monitoring the status of the display may include, but is not limited to: power supply status, power supply test results, AC input current, temperature sensor readings, fan speed, video input status, firmware revision, and light level sensor readings. Also, adjustments or state switching may be performed with respect to settings including, but not limited to: on/off, brightness level, enabling/disabling ambient light sensor, various alert settings, IP address, customer defined text/video, display matrix settings, display of image settings via OSD, and various software functions. These settings/states may be monitored and altered from either of the two data interface connections 32 and 33.

As shown herein, various electronic assemblies of an exemplary electronic display may be easily removed, serviced, and/or replaced without removal of the display from its mounted position. This is beneficial at least with respect to the downtime of the display for servicing, the cost of servicing, the risk of damaging the display by removing the display from its mounted position and transporting it to an environment suitable for servicing, and the risk of investing in an expensive display which may need to be entirely removed and replaced due to the failure of one small internal component. Further, electronic assembly removal, servicing, and/or replacement without display demounting permits manufacturers to offer a variety of different display types, while only having to manufacture a single base model. Manufacturers may offer a number of different display controller assemblies that can meet a variety of user needs. Users can also upgrade display controller assemblies as their needs change or as the technology advances. Users may easily remove the old electronic assemblies and install the new electronic assemblies without requiring special equipment or extensive training. Each removable assembly may be held in place with common mechanical fastening means (such as a screw) so that removal/installation can be done with commonly available tools and a minimal amount of guidance from the manufacturer. Alternatively, closing tabs may be used in other embodiments, which closing tabs may be designed to permit tool-less tab release and subsequent electronic assembly removal.

Having shown and described various exemplary electronic display embodiments, those skilled in the art will realize that many variations and modifications may be made to affect the described embodiments and still be within the scope of the general inventive concept. Thus, many of the elements indicated above may be altered or replaced by different elements that will provide the same result and fall within the spirit of the claimed embodiments.

What is claimed is:

1. An electronic display comprising:
   a housing;
   an electronic image-producing assembly located within the housing;
   a backplane located within the housing, the backplane in electrical communication with the electronic image-producing assembly;
   a removable electronic assembly in the form of a timing and control unit located within the housing, the timing and control unit electrically connected to the backplane through releasable engagement of a shared self-aligning electrical connector; and
   an access opening through a wall of the housing, the opening dimensioned to allow passage of the timing and control unit therethrough.

2. The electronic display of claim 1, further comprising a data interface in electrical communication with the backplane and adapted to communicate with a personal computer.

3. The electronic display of claim 1, wherein:
   the electronic image-producing assembly is selected from the group consisting of an OLED display, a plasma display, a LCD display, and a backlit LCD display.

4. The electronic display of claim 1, further comprising:
   N+1 power supplies removably connected to the backplane and in electrical communication with the backplane;
   where N is the number of power supplies that are necessary to power the electronic image-producing assembly.

5. The electronic display of claim 1, wherein the self-aligning electrical connector is a blind mate connector.

6. The electronic display of claim 1, further comprising an access panel removably installed in the access opening.

7. The electronic display of claim 1, wherein an analog-to-digital converter is integrated with the timing and control unit.

8. An electronic display comprising:
   a housing having a front, a back, and a plurality of side walls;
   an electronic image-producing assembly located within the housing;
   a backplane located within the housing, the backplane in electrical communication with the electronic image-producing assembly and including a first portion of a self-aligning electrical connector;
   a removable electronic assembly in the form of a timing and control unit located within the housing and including a mating portion of the self-guiding electrical connector, the timing and control unit electrically connected to the backplane through releasable engagement of the first and mating portions of the self-aligning electrical connector; and
   an access opening through the front or through a side wall of the housing, the access opening located adjacent to the timing and control unit and dimensioned to allow passage of the timing and control unit therethrough.

9. The electronic display of claim 8, further comprising a data interface in electrical communication with the backplane and adapted to communicate with a personal computer.

10. The electronic display of claim 8, wherein:
    the electronic image-producing assembly is selected from the group consisting of an OLED display, a plasma display, a LCD display, and a backlit LCD display.

11. The electronic display of claim 8, further comprising:
    N+1 power supplies removably connected to the backplane and in electrical communication with the backplane;
    where N is the number of power supplies that are necessary to power the electronic image-producing assembly.

12. The electronic display of claim 8, wherein the self-aligning electrical connector is a blind mate connector.

13. The electronic display of claim 8, further comprising an access panel removably installed in the access opening.

14. The electronic display of claim 8, wherein an analog-to-digital converter is integrated with the timing and control unit.

15. An electronic display comprising:
    a housing having a front, a back, and a plurality of side walls, the back of the housing configured for mounting of the electronic display on a vertical surface;
    an electronic image-producing assembly located within the housing and oriented to display an image along the front of the housing;
    a backplane located within the housing, the backplane in electrical communication with the electronic image-producing assembly and including a first portion of a self-aligning electrical connector;
    a removable electronic assembly in the form of a combined timing and control unit and analog-to-digital display converter located within the housing and including a mating portion of the self-guiding electrical connector, the removable electronic assembly electrically connected to the backplane through releasable engagement of the first and mating portions of the self-aligning electrical connector;
    an access opening through the front or through a side wall of the housing, the access opening located adjacent to the removable electronic assembly and dimensioned to allow the removable electronic assembly to be disconnected from the backplane and removed from the housing through the access opening while the removable electronic display is mounted to a vertical surface; and
    a removable access panel installed in the access opening.

16. The electronic display of claim 15, further comprising a data interface in electrical communication with the backplane and adapted to communicate with a personal computer.

17. The electronic display of claim 15, wherein:
    the electronic image-producing assembly is selected from the group consisting of an OLED display, a plasma display, a LCD display, and a backlit LCD display.

18. The electronic display of claim 15 further comprising:
    N+1 power supplies removably connected to the backplane and in electrical communication with the backplane;
    where N is the number of power supplies that are necessary to power the electronic image-producing assembly; and
    where the power supplies are hot swappable.

19. The electronic display of claim 15, wherein the self-aligning electrical connector is a blind mate connector.

20. The electronic display of claim 15, further comprising a lock mechanism associated with the access panel, the lock mechanism configured to prevent unauthorized removal of the access panel.

* * * * *